United States Patent
Yu et al.

(10) Patent No.: US 9,502,386 B2
(45) Date of Patent: *Nov. 22, 2016

(54) FAN-OUT PACKAGE STRUCTURE AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/845,593

(22) Filed: Sep. 4, 2015

(65) Prior Publication Data

US 2015/0380388 A1    Dec. 31, 2015

Related U.S. Application Data

(63) Continuation of application No. 14/456,411, filed on Aug. 11, 2014, now Pat. No. 9,129,944, which is a
(Continued)

(51) Int. Cl.
*H01L 25/065*     (2006.01)
*H01L 23/48*     (2006.01)
(Continued)

(52) U.S. Cl.
CPC ....... *H01L 25/0657* (2013.01); *H01L 21/6835* (2013.01); *H01L 21/6836* (2013.01); *H01L 21/78* (2013.01); *H01L 23/3114* (2013.01); *H01L 23/34* (2013.01); *H01L 23/481* (2013.01); *H01L 24/24* (2013.01); *H01L 24/96* (2013.01); *H01L 24/97* (2013.01); *H01L 21/4853* (2013.01); *H01L 21/568* (2013.01); *H01L 23/49822* (2013.01); *H01L 24/05* (2013.01);
(Continued)

(58) Field of Classification Search
CPC .......... H01L 25/0657; H01L 23/3114
See application file for complete search history.

(56) References Cited

U.S. PATENT DOCUMENTS

8,098,508 B2    1/2012   Janzen
8,362,602 B2    1/2013   Sasaki et al.
(Continued)

*Primary Examiner* — Roy Potter
(74) *Attorney, Agent, or Firm* — Slater Matsil, LLP (57) ABSTRACT

A package includes a device die including a first plurality of metal pillars at a top surface of the device die. The package further includes a die stack including a plurality of dies bonded together, and a second plurality of metal pillars at a top surface of the die stack. One of the device die and the plurality of dies includes a semiconductor substrate and a through-via penetrating through the semiconductor substrate, A polymer region includes portions encircling the device die and the die stack, wherein a bottom surface of the polymer region is substantially level with a bottom surface of the device die and a bottom surface of the die stack. A top surface of the polymer region is level with top ends of the first and the second plurality of metal pillars. Redistribution lines are formed over the first and the second plurality of metal pillars.

20 Claims, 12 Drawing Sheets

Related U.S. Application Data continuation-in-part of application No. 13/896,889, filed on May 17, 2013, now Pat. No. 8,803,306.

(51) Int. Cl.

| | |
|---|---|
| *H01L 21/78* | (2006.01) |
| *H01L 23/00* | (2006.01) |
| *H01L 23/34* | (2006.01) |
| *H01L 21/683* | (2006.01) |
| *H01L 23/31* | (2006.01) |
| *H01L 21/48* | (2006.01) |
| *H01L 21/56* | (2006.01) |
| *H01L 23/498* | (2006.01) |

(52) U.S. Cl.
CPC ............... *H01L 24/06* (2013.01); *H01L 24/08* (2013.01); *H01L 24/13* (2013.01); *H01L 24/16* (2013.01); *H01L 24/32* (2013.01); *H01L 24/73* (2013.01); *H01L 24/80* (2013.01); *H01L 24/92* (2013.01); *H01L 2221/68318* (2013.01); *H01L 2221/68327* (2013.01); *H01L 2221/68372* (2013.01); *H01L 2221/68381* (2013.01); *H01L 2224/0401* (2013.01); *H01L 2224/0557* (2013.01); *H01L 2224/06181* (2013.01); *H01L 2224/08145* (2013.01); *H01L 2224/08146* (2013.01); *H01L 2224/12105* (2013.01); *H01L 2224/131* (2013.01); *H01L 2224/16145* (2013.01); *H01L 2224/16146* (2013.01); *H01L 2224/16225* (2013.01); *H01L 2224/24137* (2013.01); *H01L 2224/32145* (2013.01); *H01L 2224/73204* (2013.01); *H01L 2224/73253* (2013.01); *H01L 2224/73259* (2013.01); *H01L 2224/80895* (2013.01); *H01L 2224/92125* (2013.01); *H01L 2224/92224* (2013.01); *H01L 2225/06517* (2013.01); *H01L 2225/06541* (2013.01); *H01L 2924/1032* (2013.01); *H01L 2924/10252* (2013.01); *H01L 2924/10253* (2013.01); *H01L 2924/10271* (2013.01); *H01L 2924/12042* (2013.01); *H01L 2924/1431* (2013.01); *H01L 2924/1432* (2013.01); *H01L 2924/1434* (2013.01); *H01L 2924/1436* (2013.01); *H01L 2924/1437* (2013.01); *H01L 2924/181* (2013.01); *H01L 2924/18161* (2013.01)

(56) References Cited

U.S. PATENT DOCUMENTS

| | | |
|---|---|---|
| 8,513,795 B2 | 8/2013 | Yang et al. |
| 8,803,306 B1 * | 8/2014 | Yu ..................... H01L 25/0652 257/686 |
| 2013/0119527 A1 | 5/2013 | Luo et al. |
| 2013/0119528 A1 | 5/2013 | Groothuis et al. |

\* cited by examiner

FAN-OUT PACKAGE STRUCTURE AND METHODS FOR FORMING THE SAME

PRIORITY CLAIM AND CROSS-REFERENCE

This application is a continuation application of U.S. patent application Ser. No. 14/456,411, entitled "Fan-out Package Structure and Methods for Forming the Same," filed Aug. 11, 2014, which application is a continuation-in-part application of the following commonly-assigned U.S. patent application Ser. No. 13/896,889, entitled "Fan-Out Package Structure and Methods for Forming the Same," filed May 17, 2013, which application further claims the benefit of the following provisionally filed U.S. patent application: Application Ser. No. 61/754,362, entitled "Fan-Out Package Structure and Methods for Forming the Same," filed Jan. 18, 2013, which applications are hereby incorporated herein by reference.

BACKGROUND

In integrated circuit applications, more and more functions are integrated into products. For example, different functional elements such as 3G video elements, WiFi elements, Bluetooth elements, and audio/video elements may need to be integrated together to form an application.

In conventional integration schemes, different components are bonded to an interposer, which is further bonded to a package substrate. For example, in mobile applications, a power management integrated circuit die, a transceiver die, and a multi-layer ceramic capacitor may be bonded using this scheme. The resulting package is typically very thick and large in area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out package structure and the methods of forming the same are provided in accordance with various exemplary embodiments. The intermediate stages of forming the fan-out package structure are illustrated. The variations of the embodiments are discussed. Throughout the various views and illustrative embodiments, like reference numbers are used to designate like elements.

FIGS. 1 through 9 illustrate the cross-sectional views of intermediate stages in the formation of an interconnect structure in accordance with some embodiments. The steps shown in FIGS. 1 through 9 are also illustrated schematically in the process flow shown in FIG. 12. In the subsequent discussion, the process steps shown in FIGS. 1 through 9 are discussed referring to the process steps in FIG. 12.

Figure 1:
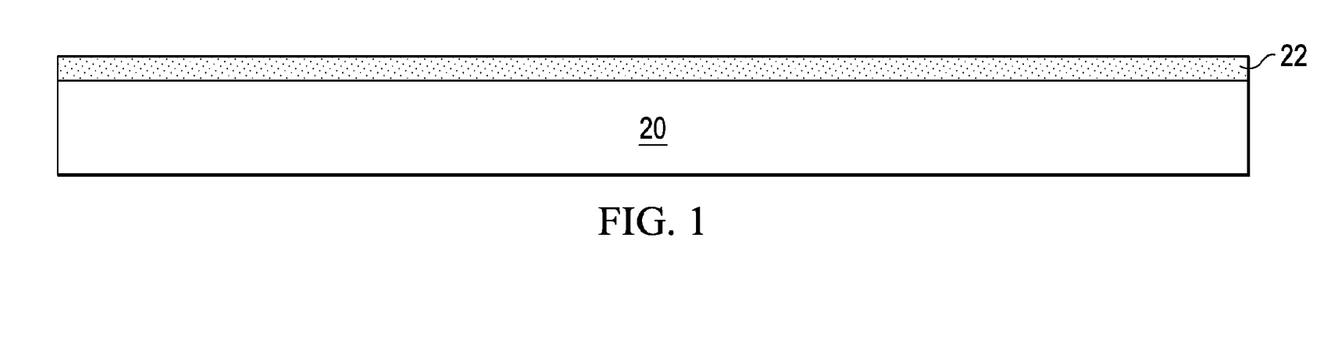
FIGS. 1 through 9 illustrate cross-sectional views of intermediate stages in the manufacturing of a fan-out package structure in accordance with some exemplary embodiments.

FIG. 1 illustrates carrier 20 and release layer 22 formed on carrier 20. Carrier 20 may be a glass carrier, a ceramic carrier, or the like. Carrier 20 may have a round top-view shape and may have the size of a silicon wafer, as shown in FIG. 2B. Release layer 22 may be formed of a polymer-based material, which can be removed along with carrier 20 from the overlying structures formed in subsequent steps. In accordance with some embodiments of the present disclosure, release layer 22 is formed of an epoxy-based thermal-release material. Release layer 22 may also be referred to as a Light-To-Heat Conversion (LTHC) layer in some embodiments, which is capable of releasing the structures formed thereon under the heat of the light. For example, release layer 22 may be formed of an Ultra-Violet (UV) glue. Release layer 22 may be dispensed as a liquid and cured. In alternative embodiments, release layer 22 is a laminate film and is laminated onto carrier 20. The top surface of release layer 22 is coplanar and has a high degree of co-planarity.

Figure 2A:
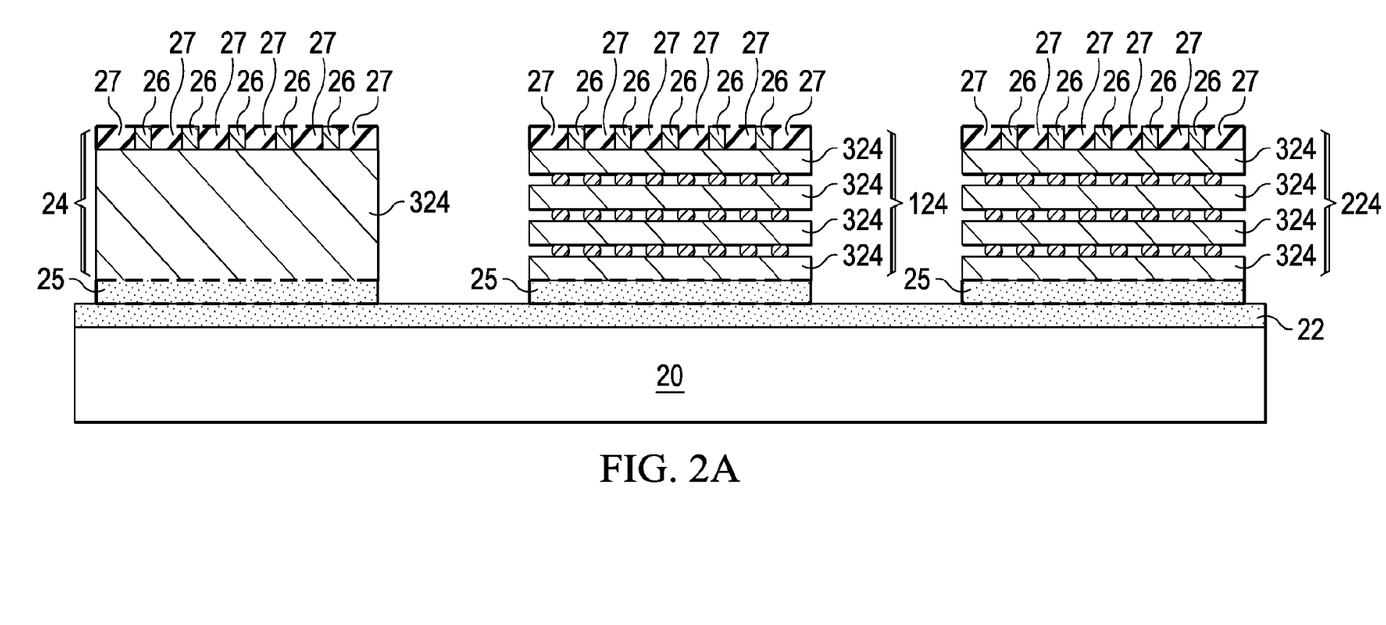
Figure 2B:
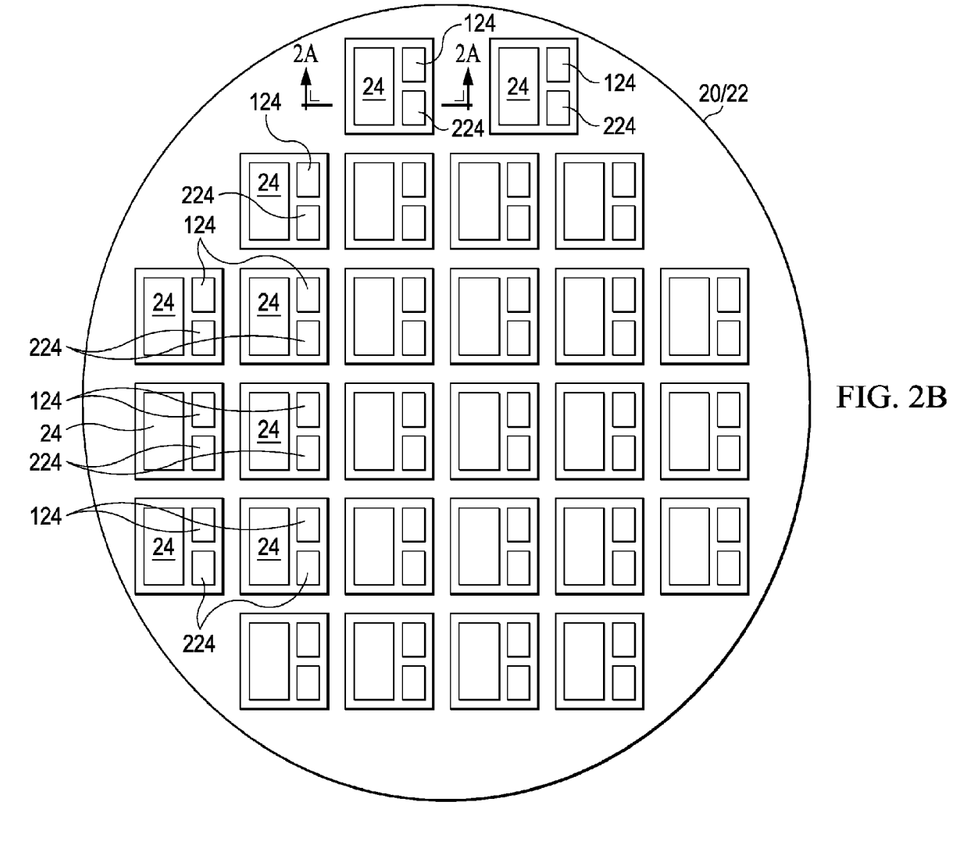

FIGS. 2A and 2B illustrate the placement of device die(s) 24 and die stacks 124 and 224, wherein FIG. 2A illustrates a cross-sectional view, and FIG. 2B illustrates a top view. Device die 24 and die stacks 124 and 224 are placed over release layer 22. In some embodiments, device die 24 and die stacks 124 and 224 are directly attached to release layer 22, which is adhered to carrier 20. In alternative embodiments, each of device die 24 and die stacks 124 and 224 is attached to release layer 22 through Die-Attach Film (DAF) 25, which is an adhesive layer. DAFs 25 are illustrated using dashed lines to indicate that they may or may not be used. In subsequent figures, DAFs 25 are not illustrated, although they may also be formed. Device die 24 may be a logic device die including logic transistors therein. In some exemplary embodiments, device die 24 is a Central Processing Unit (CPU) die. In other embodiments, device die 24 is a Graphics Processing Unit (GPU) die. Device die 24 may include a semiconductor substrate and active devices (such as transistors, not shown) formed on a surface of the semiconductor substrate.

Each of die stacks 124 and 224 may include a plurality of memory dies 324 bonded together to form a memory stack. Die stacks 124 and 224 may include Dynamic Random Access Memory (DRAM) dies, Static Random Access Memory (SRAM) dies, or memory dies formed of other types of memories. In some embodiments, memory dies 324 are pre-bonded (for example, through solder bonding, direct metal-to-metal bonding, or the like) to form die stacks 124 and 224, and then the bonded die stacks 124 and 224 are placed over carrier 20. In some embodiments, die stacks 124 and 224 are formed of a same type of memory (such as SRAM or DRAM). In alternative embodiments, die stacks 124 and 224 are the stacks of different types of memories.

Electrical connectors 26 are formed as the top portions of device die 24 and die stacks 124 and 224, and are electrically coupled to the devices in device die 24 and die stacks 124 and 224. In some embodiments, electrical connectors 26 include metal pillars 26 (such as copper pillars), which may be pre-formed before device die 24 and die stacks 124 and 224 are placed over carrier 20. Metal pillars 26 may be solder-free, and may comprise vertical sidewalls. In some embodiments, dielectric layers 27 are formed at the top surfaces of device die 24 and die stacks 124 and 224, with metal pillars 26 having at least lower portions, or entireties, in dielectric layer 27. The top surfaces of dielectric layers 27 may also be substantially level with the top ends of metal pillars 26. Dielectric layers 27 may comprise polyimide, polybenzoxazole (PBO), an oxide layer, a nitride layer, or multi-layers thereof. Alternatively, dielectric layers 27 are not formed, and metal pillars 26 protrude above the remaining portions of device die 24 and die stacks 124 and 224. In subsequently illustrated drawings, dielectric layers 27 are not illustrated, although they may also exist in some embodiments. The thicknesses of device die 24, die stacks 124 and 224, and the heights of metal pillars 26 are controlled so that the top ends of metal pillars 26 of device die 24 are substantially level with the top ends of metal pillars 26 of die stacks 124 and 224. Furthermore, since device die 24 and die stacks 124 and 224 are placed over carrier 20 (for example, on adhesive 22), the back surfaces of device die 24 and die stacks 124 and 224 are level with each other.

Figure 10:
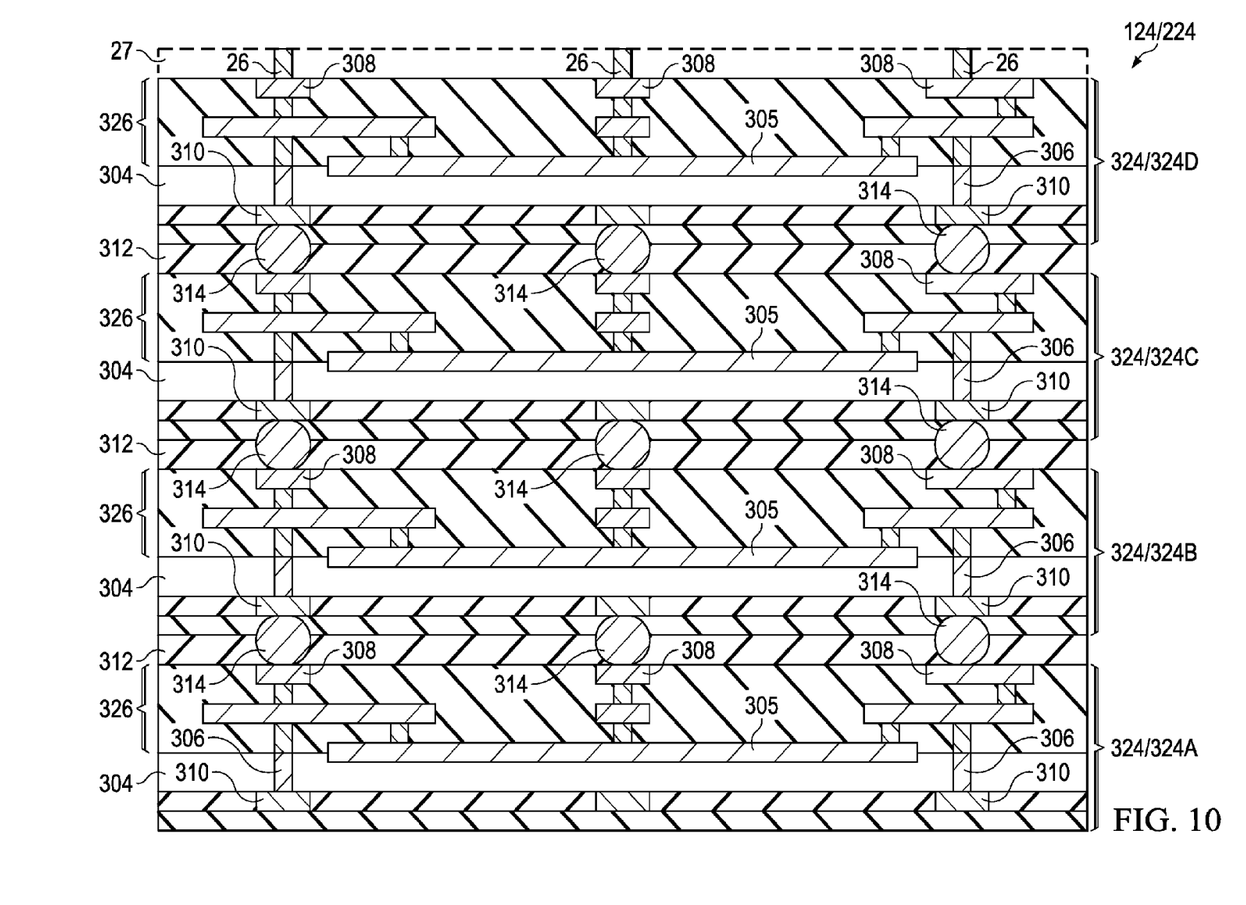
FIG. 10 illustrates a magnified cross-sectional view of a die stack in accordance with some embodiments.

FIG. 10 illustrates a magnified view of die stack 124 or 224 (referred to as 124/224 hereinafter) in accordance with some embodiments of the present disclosure. Each of device dies 324 (including 324A, 324B, 324C, and 324D) in die stack 124/224 includes semiconductor substrate 304, wherein the active devices 305 such as transistors are formed at a surface of semiconductor substrate 304. In some embodiments, semiconductor substrate 304 is a crystalline silicon substrate. In alternative embodiments, semiconductor substrate 304 includes another semiconductor material such as germanium, silicon germanium, a III-V compound semiconductor material, or the like. Metal lines and vias (not shown) are formed in interconnect structures 326 of device dies 324 to interconnect the integrated circuit devices in device dies 324.

Through-vias (sometimes referred to as through-silicon vias or through-semiconductor vias) 306 are formed to penetrate through semiconductor substrates 304. Electrical connectors 308 are formed on the top surfaces of device dies 324. Electrical connectors 310 may further be formed on the bottom surfaces of device dies 324. Electrical connectors 308 and 310 may be metal pads, metal pillars, or the like. Electrical connectors 308 are electrically coupled to the respective electrical connectors 310 through through-vias 306. Furthermore, the integrated circuits 305 in device dies 324 and electrical connectors 308 may be electrically connected to electrical connectors 310 in device dies 324.

As shown in FIG. 10, device dies 324 are bonded together to form die stack 124/224. In some embodiments, the bonding is through solder regions 314. In accordance with alternative embodiments, the bonding may be direct metal-to-metal bonding without using solder. In accordance with some embodiments of the present disclosure, device dies 324 are identical to each other. In these embodiments, device dies 324 may be formed using identical process steps, wherein the different reference numerals 324A, 324B, 324C, and 324D are used to indicate that they are at different levels in die stack 124/224. In alternative embodiments, device dies 324 have different structures including different circuits and/or different metal routing, etc.

In some embodiments, underfill 312 is dispensed into the gaps between the stacked device dies 324. Underfill 312 is then cured, for example, in a thermal curing process. In alternative embodiments, no underfill is dispensed, and the gaps between device dies 324 may be filled by molding material 40 (FIG. 3) in the subsequent molding step.

Figure 11:
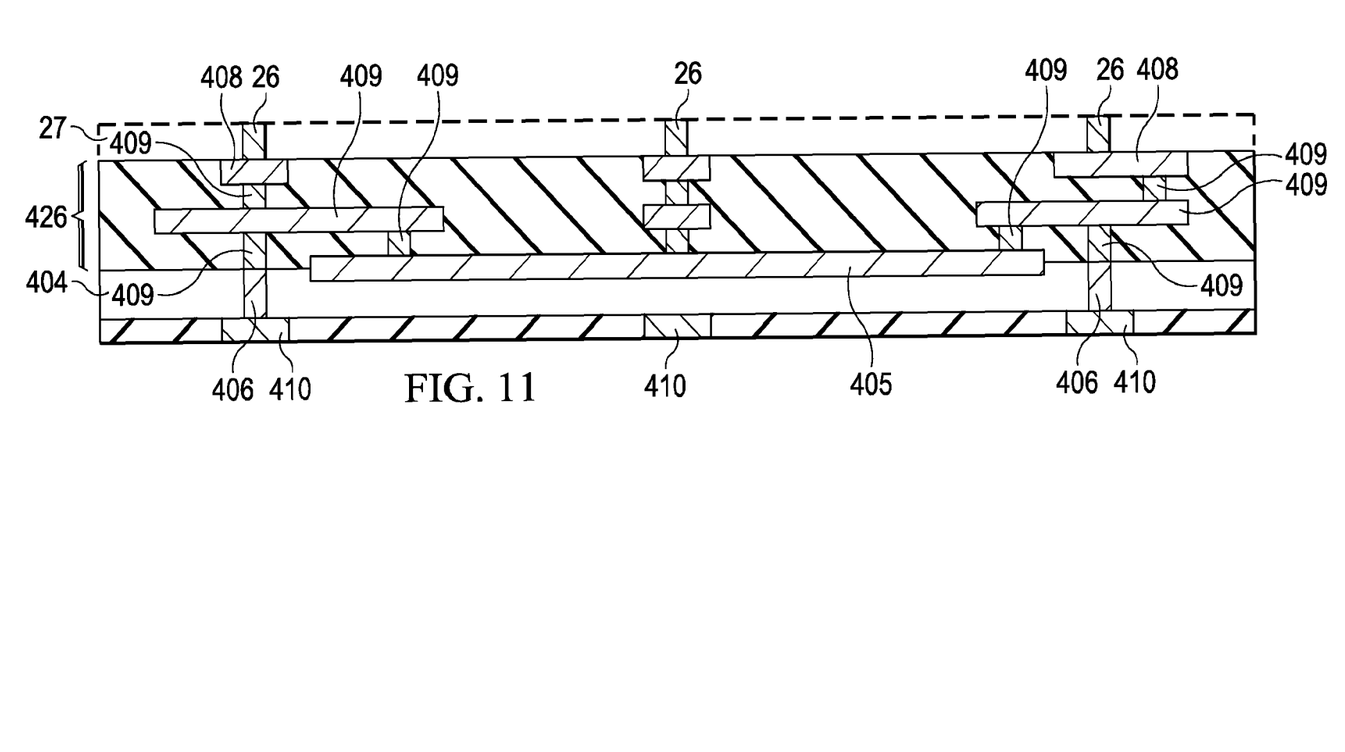
FIG. 11 illustrates a magnified cross-sectional view of a device die in accordance with some embodiments.

FIG. 11 illustrates a magnified view of device die 24 in accordance with some embodiments of the present disclosure. Device die 24 may or may not include through-vias in the respective semiconductor substrate. Through-vias are formed when another package is to be bonded to the resulting package 48 (FIG. 8) from the top side of package 48. FIG. 11 schematically illustrates device die 24 with through-vias 406 being formed. In these embodiments, device die 24 includes semiconductor substrate 404, wherein the active devices 405 such as transistors are formed at a surface of semiconductor substrate 404. Semiconductor substrate 404 may be a crystalline silicon substrate, and/or may include germanium, silicon germanium, a III-V compound semiconductor material, or the like.

Metal lines and vias 409 are formed in the interconnect structures 426 of device die 24 to interconnect integrated circuit devices 405 in device die 24. Through-vias 406 are formed to penetrate through semiconductor substrate 404. Metal pillars 26 are formed on the top surface of device die 24, wherein metal pillars 26 may be embedded in dielectric layer 27 in some embodiments. In alternative embodiments, metal pillars 26 protrude above the rest of device die 24. Electrical connectors 410 may be formed at the bottom surfaces of device dies 324 in some embodiments. Electrical connectors 410 may be metal pads, metal pillars, or the like, and may or may not include solder regions. In accordance with other embodiments, through-vias 406 and electrical connectors 410 are not formed. Metal pillars 26 are electrically coupled to electrical connectors 410 through through-vias 406. Furthermore, the integrated circuits in device die 24 and electrical connectors 408 are electrically connected to electrical connectors 410 in device die 24.

FIG. 2B illustrates a top view of the structure in FIG. 2A. The cross-sectional view in FIG. 2A is obtained from a plane crossing line 2A-2A in FIG. 2B. Furthermore, device die 24 and die stacks 124 and 224 are shown in the same plane in FIG. 2A for clarity, although they are not necessarily in the same plane, as shown in FIG. 2B, for example. In some embodiments, the placement of device die 24 and die stacks 124 and 224 is at the wafer level, and hence there are a plurality of device dies 24 and a plurality of die stacks 124 and 224 placed over carrier 20. FIG. 2B illustrates that carrier 20 has a round top-view shape. In alternative embodiments, carrier 20 have a rectangular top-view shape, and device die 24 and die stacks 124 and 224 may be laid out as an array. In FIG. 2B, the rectangles (not marked) encircling each groups of device die 24 and die stacks 124 and 224 mark the boundaries of the respective packages 48 (FIG. 7), which packages are formed in subsequent steps.

Figure 3:
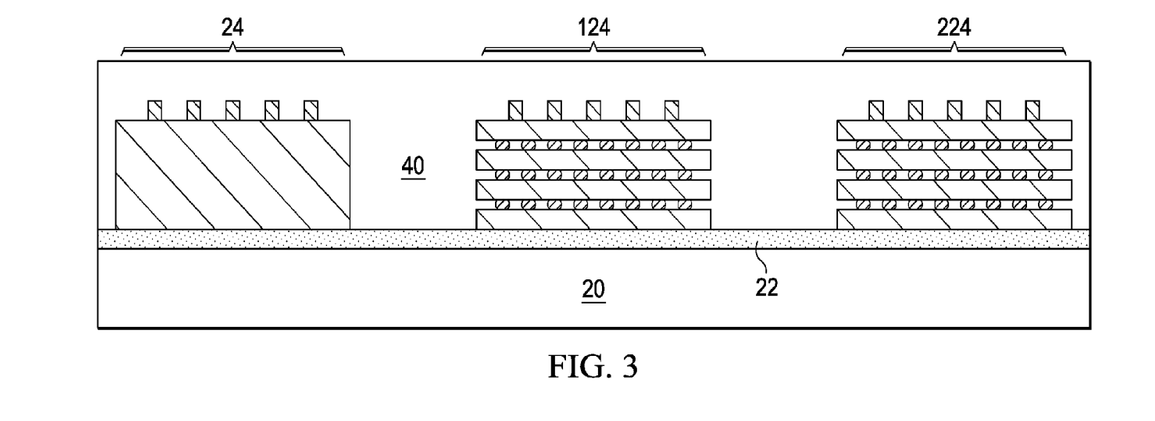

Referring to FIG. 3, molding material 40 is dispensed and molded on device die 24 and die stacks 124 and 224. Molding material 40 fills the gaps between device die 24 and die stacks 124 and 224, and may be in contact with adhesive layer 22. Furthermore, molding material 40 may be filled into the gaps between metal pillars 26 if dielectric layers 27 (FIG. 2) are not formed. Molding material 40 comprises a polymer in some embodiments. For example, molding material 40 may include a molding compound, a molding underfill, an epoxy, or a resin. The top surface of molding material 40 is higher than the top ends of metal pillars 26. The bottom surface of molding material 40 is level with the back surfaces of device die 24 and die stacks 124 and 224. After being dispensed, molding material 40 is cured.

Figure 4A:
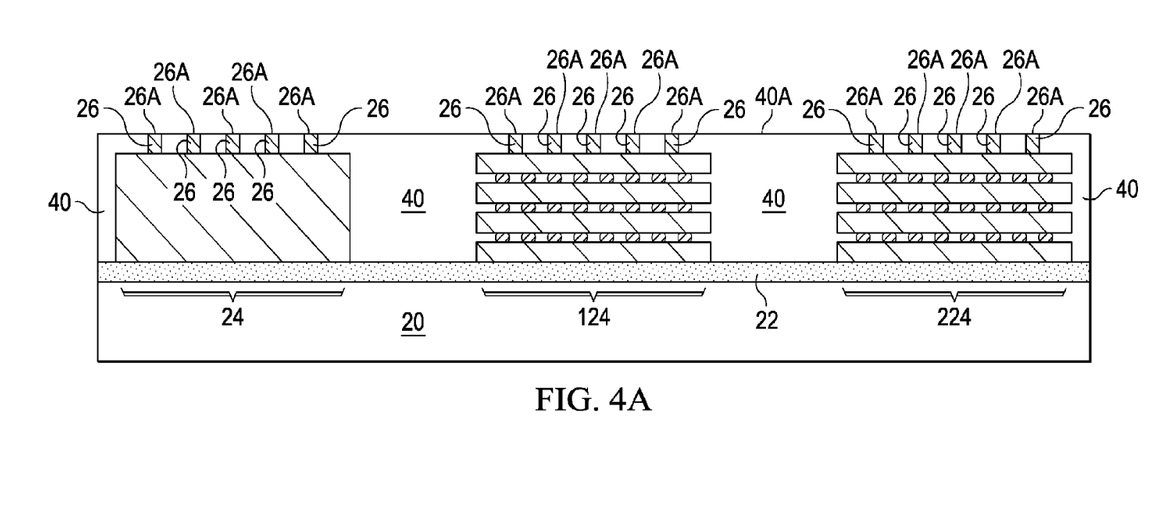

Next, a planarization step, which may be a grinding step or a Chemical Mechanical Polish (CMP), is performed to thin molding material 40, until metal pillars 26 are exposed. The resulting structure is shown in FIG. 4A. The top ends 26A of metal pillars 26 in device die 24 and die stacks 124 and 224 are level with each other, and are level with top surface 40A of molding material 40. In some embodiments in which no dielectric layer 27 (FIG. 2) is formed, molding material 40 encircles, and is in contact with, each of metal pillars 26, as shown in FIG. 4A.

Figure 4B:
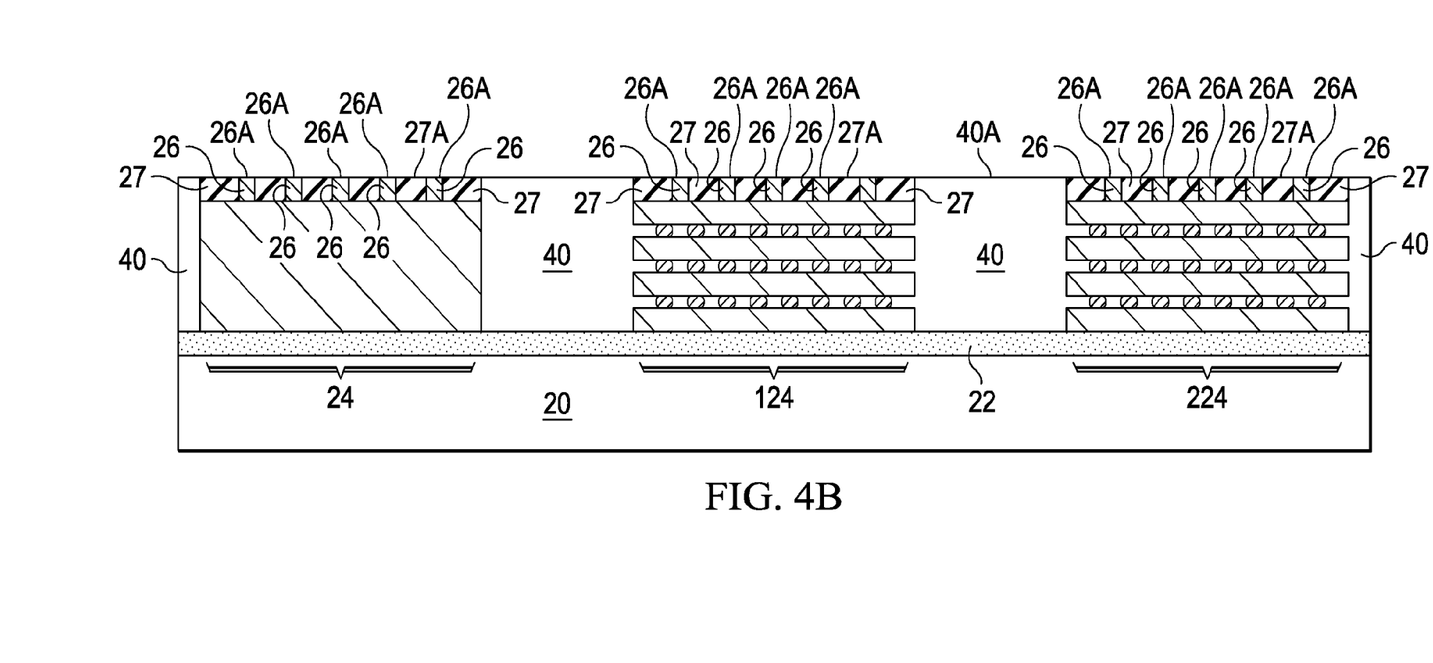

In alternative embodiments, as shown in FIG. 4B, dielectric layers 27 are formed as the top surface layers of device die 24 and/or die stacks 124/224, the top ends 26A of metal pillars 26 are level with each other, and are substantially level with the surfaces 27A of dielectric layers 27 and top surface 40A of molding material 40.

In FIGS. 4A and 4B, the top surfaces of metal pillars 26 of device die 24 and die stacks 124/224 are coplanar, and are coplanar with the top surfaces of dielectric layers 27 (FIG. 4B, if any) and molding material 40. Metal pillars 26 of device die 24, however, may have the same height as or different heights from the height of the metal pillars 26 in die stacks 124/224. Accordingly, the bottom ends of metal pillars 26 of device die 24 may or may not be coplanar with the bottom ends of the metal pillars 26 in die stacks 124/224.

Figure 5:
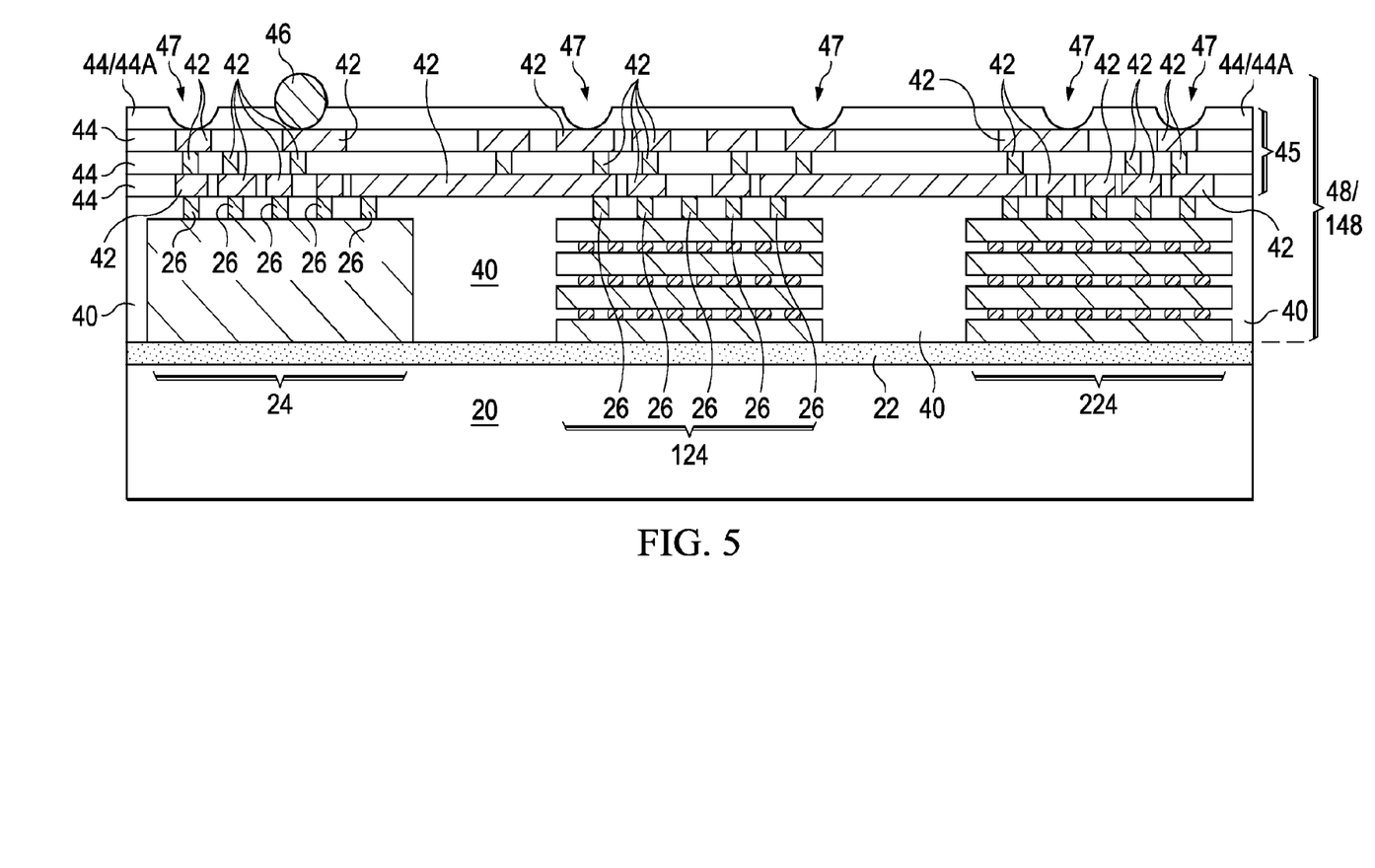

Next, referring to FIG. 5, Redistribution Lines (RDLs) 42 are formed over molding material 40. RDLs 42 are also electrically connected to, and may interconnect, metal pillars 26. RDLs 42 are formed in dielectric layers 44. There may be one, two, three, or more redistribution layer, each including a plurality of RDLs 42 that is at the same level. RDLs 42 further include vias that interconnect the RDLs in neighboring redistribution layers. The RDLs 42 in the bottom redistribution layer and the respective dielectric layer 44 have bottom surfaces in contact with the top ends of metal pillars 26 and the top surface of molding material 40. In some embodiments, RDLs 42 are formed by forming and patterning dielectric layers 44, and forming RDLs 42 in the openings in the patterned dielectric layers 44. In alternative embodiments, RDLs 42 are formed by depositing metal layers, patterning the metal layers, and filling the gaps between RDLs 42 with dielectric layers 44. In yet alternative embodiments, RDLs 42 and dielectric layers 44 are formed using damascene processes. RDLs 42 may comprise copper, nickel, palladium, aluminum, tungsten, or the like. Dielectric layers 44 may comprise photo-sensitive materials such as polyimide, PBO, or the like, which may be patterned without using additional photo resists. In some embodiments, all of dielectric layers 44 are formed using polymers such as photo-sensitive materials. Dielectric layers 44 may also be formed of a non-organic material or materials such as oxides and/or nitrides. RLDs 42 and dielectric layers 44 are in combination referred to as interposer 45 throughout the description. In accordance with the embodiments of the present disclosure, interposer 45 is formed starting from molding material 40, device die 24, and die stacks 124 and 224, which in combination act as a wafer having enough thickness and strength to support the formation of interposer 45. As a result, interposer 45 may be very thin, for example, with a thickness smaller than about 50 µm without the concern that it may break during its formation and the subsequent handling.

The bottom layer of dielectric layers 44 is in contact with the top surface of molding material 40. Furthermore, the metal traces (RDLs) 42 in the bottom RDL layer are in contact with the top surface of molding material 40 (and dielectric layers 27, if any), wherein no adhesive is disposed between molding material 40 and the overlying dielectric layer 44 and RDLs 42.

FIG. 5 further illustrates the formation of top dielectric layer 44 (denoted as 44A), and the formation of openings 47 in top dielectric layer 44A. The top dielectric layer 44A may also be formed of a polymer such as PBO, polyimide, or the like. Openings 47 may be formed, for example through laser drill, light-exposure and developing, or the like. The metal pads that are parts of the top RDLs 42 are exposed to openings 47.

Figure 6:
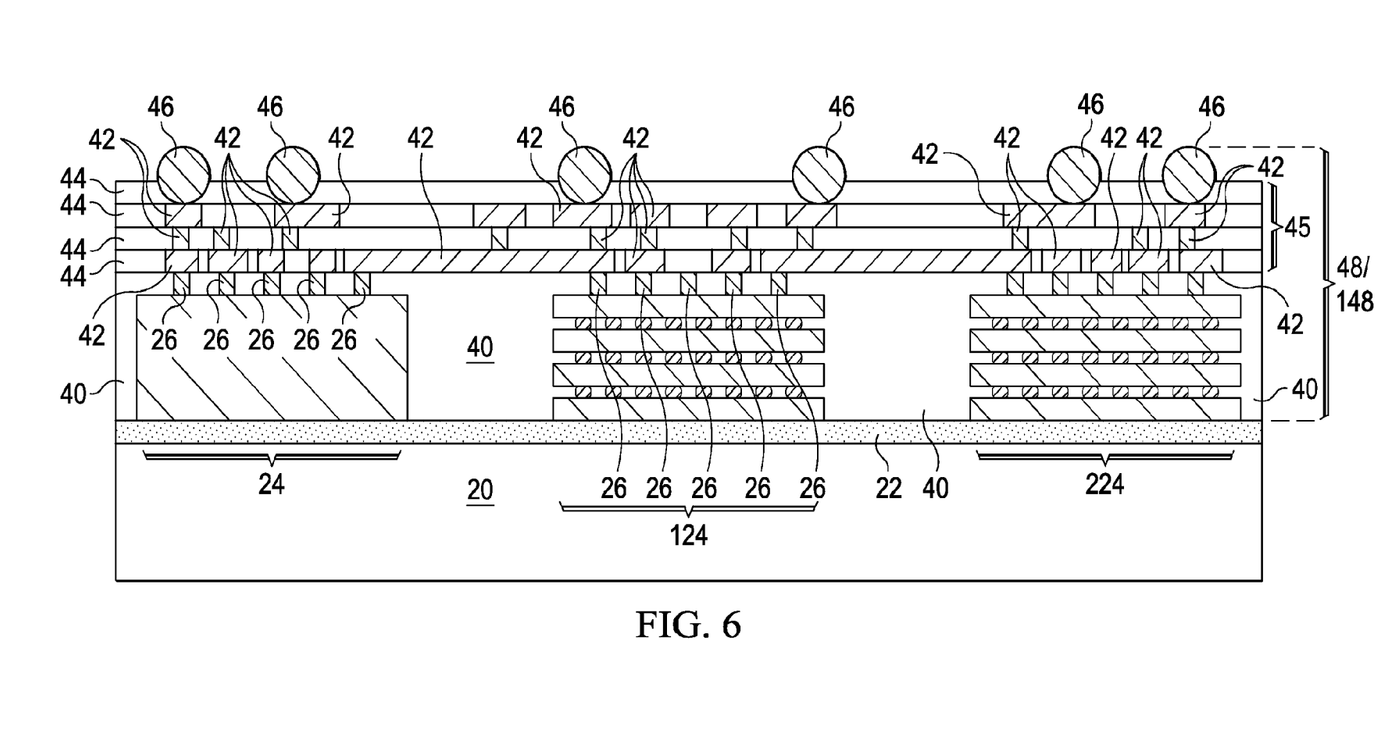

FIG. 6 illustrates the formation of electrical connectors 46 in accordance with some exemplary embodiments. The formation of connectors 46 may include placing solder balls on the exposed pad portions of RDLs 42, and then reflowing the solder balls. In alternative embodiments, the formation of connectors 46 includes performing a plating step to form solder regions over the pad portions of RDLs 42, and then reflowing the solder regions. Connectors 46 may also include metal pillars, or metal pillars and solder caps, which may also be formed through plating. Throughout the description, the combined structure including device die 24, die stacks 124 and 224, molding material 40, and the overlying RDLs 42 and dielectric layers 44 is referred to as package 48 hereinafter. Package 48 is a part of a wafer 148 that includes a plurality of packages 48.

Figure 7:
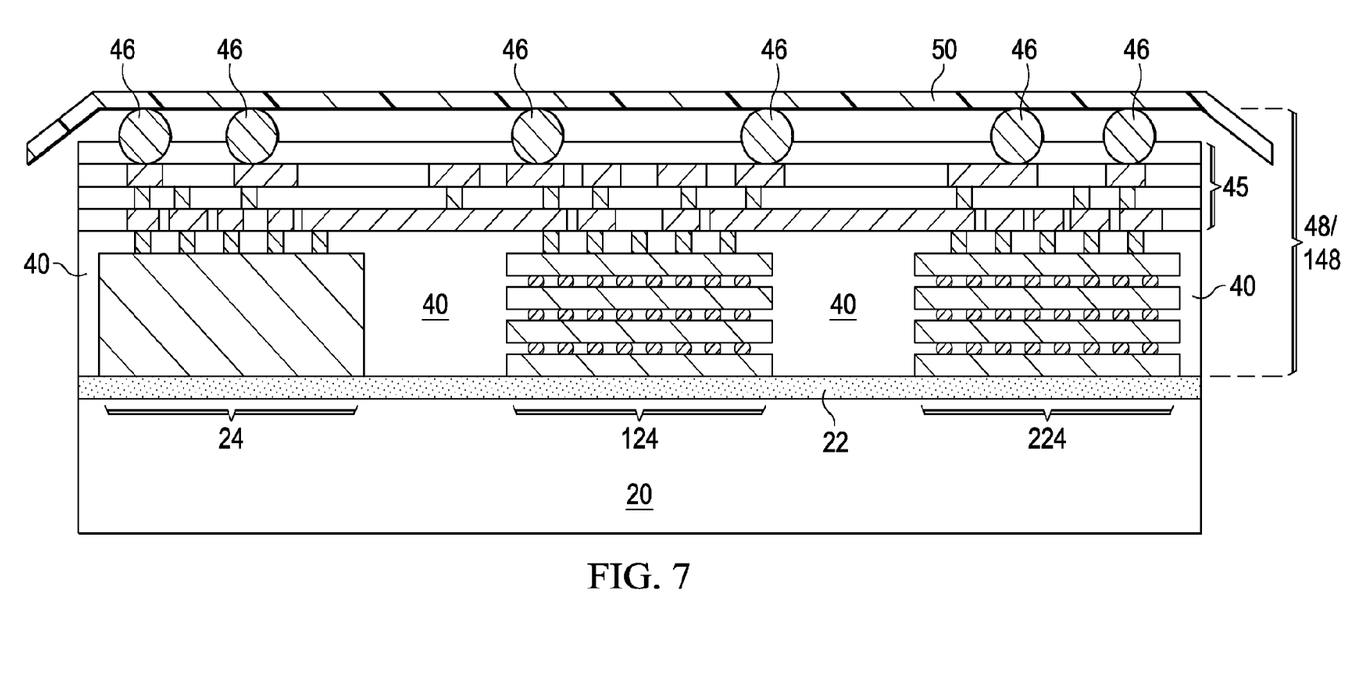

Referring to FIG. 7, dicing tape 50 is attached to package 48 and the respective wafer 148, wherein carrier 20 and dicing tape 50 are on the opposite sides of package 48. Next, carrier 20 is detached from package 48, and release layer 22 is removed. When release layer 22 is formed of LTHC, release layer 22 decomposes under the heat of light, so that carrier 20 can be removed. For example, when release layer 22 is formed of the UV glue, release layer 22 may be exposed to UV light. The resulting structure is shown in FIG. 8.

Figure 8:
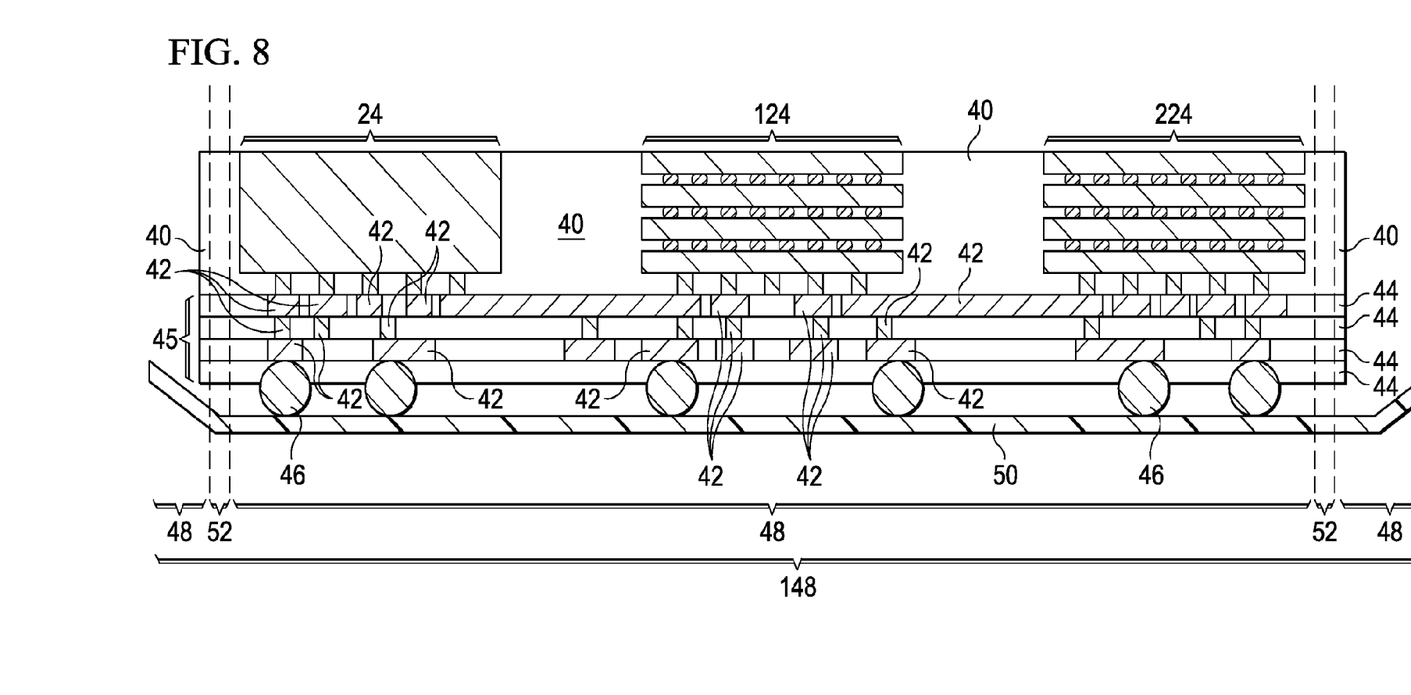

Further referring to FIG. 8, wafer 148 is sawed apart along scribe lines 52 to separate wafer 148 into a plurality of packages 48. Each of packages 48 may include device die 24 and die stacks 124 and 224, molding material 40, and a piece of interposer 45 that includes RDLs 42 and dielectric layers 44. As a result of the sawing, in the resulting packages 48, the edges of dielectric layers 44 are aligned to the respective edges of molding material 40.

Figure 9:
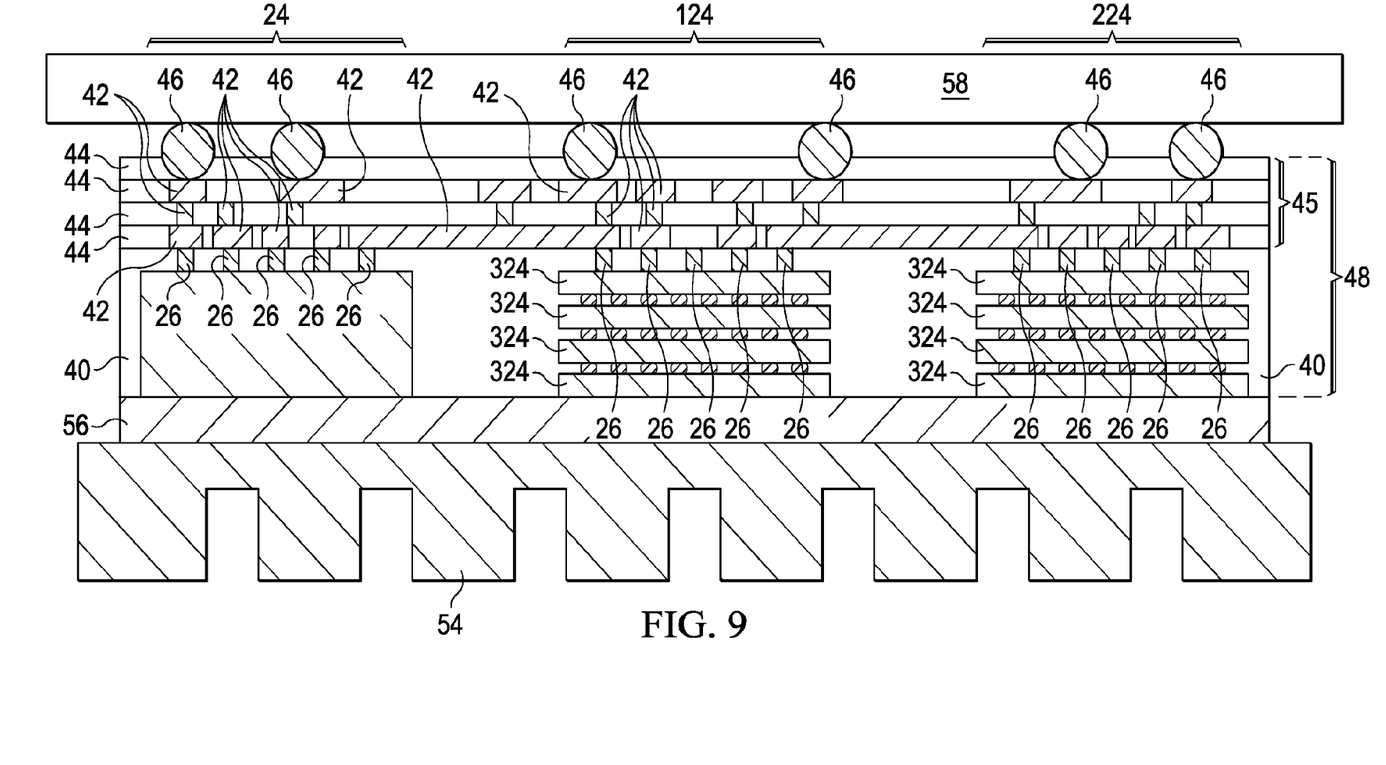

FIG. 9 illustrates the bonding and/or the attachment of package 48 to other package components. In some embodiments, connectors 46 are used to bond package 48 to another package component 58, which is a Printed Circuit Board (PCB) in some exemplary embodiments. In some embodiments, no additional interposer and package substrate are bonded between package 48 and PCB 58. Interposer 45, which is built in package 48, is used to electrically couple device die 24 and device stacks 124 and 224 to package component 58. In alternative embodiments, package 48 is bonded to an additional package substrate (not shown), which is further bonded to a PCB.

FIG. 9 also illustrates that the back surface of package 48 is attached to heat spreader 54. In some embodiments, thermal tape (or Thermal Interface Material (TIM)) 56, which has a thermal conductivity higher than the thermal conductivity of typical glues, is used to attach heat spreader 54 to package 48. Accordingly, the heat generated in device die 24 and device stacks 124 and 224 may be dissipated to heat spreader 54.

Figure 12:
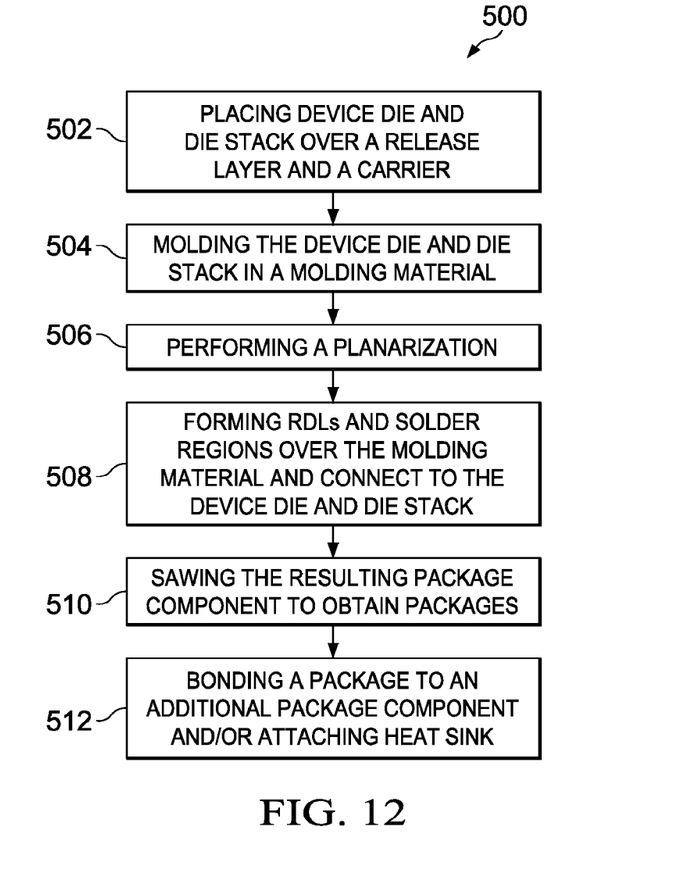
FIG. 12 illustrates an exemplary process flow for forming a package structure in accordance with some embodiments.

FIG. 12 schematically illustrates the process flow 500 for the processes in FIGS. 1 through 9. The process flow is briefly discussed herein. The details of the process flow may be found in the corresponding discussion of FIGS. 1 through 9. In step 502, device die 24 and die stacks 124 and 224 are placed over release layer 22 and carrier 20, as shown in FIGS. 2A and 2B. In step 504 of the process flow in FIG. 12, device dies 24 and die stacks 124 and 224 are molded in molding material 40, and the respective formation process is illustrated in FIG. 3. In step 506 of the process flow in FIG. 12, a planarization such as a grinding process is performed to expose the metal pillars 26 of device die 24 and die stacks 124 and 224, and the respective formation process is illustrated in FIGS. 4A and 4B. In step 508 of the process flow in FIG. 12, RDLs 42 and electrical connectors 46 are formed to connect to device die 24 and die stacks 124 and 224, and the respective formation process is illustrated in FIGS. 5 and 6. In step 510 of the process flow in FIG. 12, a die-saw process is performed to saw the structure formed in preceding formation processes into packages, and the respective formation process is illustrated in FIGS. 7 and 8. In step 512 of the process flow in FIG. 12, the resulting package is further bonded to other package components and heat sinks, and the respective formation process is illustrated in FIG. 9.

The embodiments of the present disclosure have some advantageous features. In accordance with the embodiments of the present disclosure, interposer 45 is built over the device die and device stacks after the device die and device stacks are molded. This is different from the conventional interposers that are manufactured first, and then bonded with device dies and/or device stacks. In the process for forming the packages in accordance with some embodiments, a molding material, a device die, and/or a device stack act as the carrier for forming interposer 45. Since interposer 45 does not need to be separated from the carrier (the molding compound and the dies molded therein), it can be made very thin without the concern that it may break in the subsequent handling. The thickness of the resulting package is hence significantly reduced.

In accordance with some embodiments, a package includes a device die including a first plurality of metal pillars at a top surface of the device die. The package further includes a die stack including a plurality of dies bonded together, and a second plurality of metal pillars at a top surface of the die stack. One of the device die and the plurality of dies includes a semiconductor substrate and a through-via penetrating through the semiconductor substrate. A polymer region includes portions encircling the device die and the die stack, wherein a bottom surface of the polymer region is substantially level with a bottom surface of the device die and a bottom surface of the die stack. A top surface of the polymer region is level with top ends of the first plurality of metal pillars and top ends of the second plurality of metal pillars. Redistribution lines are formed over and electrically coupled to the first and the second plurality of metal pillars.

In accordance with other embodiments, a package includes a device die having a first plurality of metal pillars at a top surface of the device die. A die stack includes a plurality of dies bonded together. A second plurality of metal pillars is at a top surface of the die stack. The package further includes a molding material encircling the device die and the die stack, and a dielectric layer over the molding material. The dielectric layer includes a bottom surface contacting a top surface of the molding material, and redistribution lines in the dielectric layer. The bottom surfaces of the redistribution lines are in contact with the top surface of the molding material. The redistribution lines are over and electrically coupled to the first and the second plurality of metal pillars.

In accordance with yet other embodiments, a package includes a device die including a first plurality of metal pillars at a top surface of the device die. The package further includes a die stack, which includes a plurality of dies bonded together. The plurality of dies has semiconductor substrates and through-vias penetrating through the respective semiconductor substrates. A second plurality of metal pillars is at a top surface of the die stack, wherein the second plurality of metal pillars is electrically coupled to the through-vias. A polymer region molds the device die and the die stack therein, wherein a top surface of the polymer region, top ends of the first plurality of metal pillars, and top ends of the second plurality of metal pillars form a first planar surface. A dielectric layer is disposed over the polymer region, wherein edges of the dielectric layer are aligned to respective edges of the polymer region. Redistribution lines are disposed in the dielectric layer. The redistribution lines are electrically coupled to the first and the second plurality of metal pillars, and wherein bottom surfaces of the redistribution lines and the dielectric layer form a second planar surface in contact with the first planar surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a device die comprising a first plurality of metal pillars at a top surface of the device die;
   a die stack comprising:
      a plurality of dies bonded together, wherein one of the device die and the plurality of dies comprises a semiconductor substrate and a through-via penetrating through the semiconductor substrate; and
      a second plurality of metal pillars at a top surface of the die stack;
   an encapsulating material encapsulating the device die and the die stack therein, wherein a top surface of the encapsulating material is level with top ends of the first plurality of metal pillars and top ends of the second plurality of metal pillars; and
redistribution lines over and electrically coupled to the first and the second plurality of metal pillars.

2. The package of claim 1 further comprising a dielectric layer, with the redistribution lines located in the dielectric layer, wherein a bottom surface of the dielectric layer is level with bottom surfaces of the redistribution lines, and wherein the bottom surface of the dielectric layer is in contact with the top surface of the encapsulating material, and the top ends of the second plurality of metal pillars.

3. The package of claim 2, wherein the dielectric layer comprises a photo-sensitive material.

4. The package of claim 2, wherein the encapsulating material comprises a portion extending into spaces between the first plurality of metal pillars, and wherein the portion of the encapsulating material comprises a top surface in contact with the dielectric layer.

5. The package of claim 1, wherein a bottom surface of the encapsulating material is substantially level with a bottom surface of the device die and a bottom surface of the die stack.

6. The package of claim 1, wherein die stack comprises a plurality of memory dies.

7. The package of claim 1 further comprising an additional dielectric layer as a top portion of the device die, wherein the first plurality of metal pillars is in the additional dielectric layer, with a top surface of the additional dielectric layer level with top ends of the first plurality of metal pillars, and wherein edges of the additional dielectric layer are aligned to respective edges of a bottom portion of the device die.

8. The package of claim 1 wherein all dielectric layers in the package and over the encapsulating material have a total thickness smaller than about 50 µm.

9. A package comprising:
a device die comprising a first plurality of metal pillars at a top surface of the device die;
a die stack comprising:
a plurality of dies bonded together; and
a second plurality of metal pillars at a top surface of the die stack, wherein a bottom die in the die stack is electrically coupled to a top die in the die stack through through-vias in the plurality of dies;
a molding material encircling the device die and the die stack;
a dielectric layer comprising a bottom surface contacting a top surface of the molding material; and
redistribution lines in the dielectric layer, wherein bottom surfaces of the redistribution lines are in contact with the top surface of the molding material, the first plurality of metal pillars, and the second plurality of metal pillars.

10. The package of claim 9, wherein a top surface of the molding material is coplanar with top surfaces of the first plurality of metal pillars and top surfaces of the second plurality of metal pillars.

11. The package of claim 9, wherein a bottom surface of the molding material is substantially coplanar with a bottom surface of the device die and a bottom surface of the die stack, and wherein a top surface of the molding material is coplanar with first top ends of the first plurality of metal pillars and second top ends of the second plurality of metal pillars.

12. The package of claim 9, wherein each of the plurality of dies in the die stack comprises:
a semiconductor substrate; and
through-vias penetrating through the semiconductor substrate.

13. The package of claim 9, wherein the device die comprises:
a semiconductor substrate; and
through-vias penetrating through the semiconductor substrate.

14. A package comprising:
a first die stack comprising:
a first plurality of dies bonded together, wherein the first plurality of dies comprises first semiconductor substrates and first through-vias penetrating through the respective first semiconductor substrates; and
a first plurality of metal pillars at a top surface of the first die stack, wherein the first plurality of metal pillars is electrically coupled to the first through-vias;
a second die stack comprising:
a second plurality of dies bonded together, wherein the second plurality of dies comprises second semiconductor substrates and second through-vias penetrating through the respective second semiconductor substrates, wherein the first plurality of dies and the second plurality of dies are different types of dies; and
a second plurality of metal pillars at a top surface of the second die stack, wherein the second plurality of metal pillars is electrically coupled to the second through-vias;
an encapsulating material encapsulating the first die stack and the second die stack therein, wherein a top surface of the encapsulating material, top ends of the first plurality of metal pillars, and top ends of the second plurality of metal pillars form a first planar surface;
a dielectric layer over the encapsulating material, wherein edges of the dielectric layer are aligned to respective edges of the encapsulating material; and
redistribution lines in the dielectric layer, wherein the redistribution lines are electrically coupled to the first and the second plurality of metal pillars, and wherein bottom surfaces of the redistribution lines and the dielectric layer form a second planar surface in contact with the first planar surface.

15. The package of claim 14, wherein the encapsulating material comprises a molding compound.

16. The package of claim 14, wherein the dielectric layer comprises a photo-sensitive material.

17. The package of claim 14, wherein a bottom surface of the first die stack and a bottom surface of the second die stack are level with a bottom surface of the encapsulating material.

18. The package of claim 14 further comprising solder regions electrically coupled to the first and the second plurality of metal pillars, wherein the solder regions are bonded to a Printed Circuit Board (PCB), and wherein the PCB and the first die stack are on opposite sides of the dielectric layer.

19. The package of claim 14, wherein the encapsulating material extends into first spaces between the first plurality of metal pillars and second spaces between the second plurality of metal pillars.

20. The package of claim 14 further comprising a device die encapsulated in the encapsulating material.

* * * * *